United States Patent
Oh et al.

(10) Patent No.: US 7,955,154 B2
(45) Date of Patent: Jun. 7, 2011

(54) FLAT PANEL DISPLAY AND METHOD FOR MANUFACTURING THE SAME

(75) Inventors: Jae Young Oh, Gyeonggi-do (KR); Soo Pool Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 638 days.

(21) Appl. No.: 11/474,363

(22) Filed: Jun. 26, 2006

(65) Prior Publication Data

US 2006/0290268 A1    Dec. 28, 2006

(30) Foreign Application Priority Data

Jun. 28, 2005 (KR) .................. 10-2005-0056123

(51) Int. Cl.
*H01J 9/26* (2006.01)
(52) U.S. Cl. .................. 445/25; 313/512; 313/504
(58) Field of Classification Search .................. 445/25; 313/504, 506, 512
See application file for complete search history.

(56) References Cited

U.S. PATENT DOCUMENTS

| | | | |
|---|---|---|---|
| 4,335,501 A | 6/1982 | Wickendon et al. | |
| 6,538,380 B1 * | 3/2003 | Kanagu et al. | 313/582 |
| 2003/0108753 A1 * | 6/2003 | Fujii et al. | 428/469 |
| 2003/0155233 A1 | 8/2003 | Morita et al. | |
| 2004/0135164 A1 | 7/2004 | Park et al. | |
| 2004/0135501 A1 * | 7/2004 | Nishikawa | 313/506 |
| 2004/0232839 A1 * | 11/2004 | Fujitani et al. | 313/582 |
| 2005/0127829 A1 | 6/2005 | Takahashi | |
| 2005/0277541 A1 * | 12/2005 | Yoshii et al. | 501/26 |
| 2006/0043866 A1 * | 3/2006 | Tsuda et al. | 313/365 |

FOREIGN PATENT DOCUMENTS

| | | |
|---|---|---|
| CN | 1424738 A | 6/2003 |
| CN | 1535253 A | 10/2004 |
| JP | 10-144468 | 5/1998 |
| WO | WO 2005/046291 | 5/2005 |

OTHER PUBLICATIONS

Combined Search and Examination Report Under Sections 17 and 18(3), dated Oct. 9, 2006, United Kingdom Patent Office.

* cited by examiner

*Primary Examiner* — Karabi Guharay
(74) *Attorney, Agent, or Firm* — Morgan, Lewis & Bockius LLP

(57) ABSTRACT

A flat panel display includes a substrate, an array on the substrate, and a glass film formed by depositing glass powder over the substrate, including the array, melting the deposited glass powder over the array and hardening the deposited glass powder over the array.

6 Claims, 5 Drawing Sheets

FLAT PANEL DISPLAY AND METHOD FOR MANUFACTURING THE SAME

This application claims the benefit of the Korean Patent Application No. P2005-0056123, filed on Jun. 28, 2005, which is hereby incorporated by reference in its entirety.

BACKGROUND OF THE INVENTION

1. Field of the Invention

The present invention relates to a display, and more particularly, to a flat panel display and method for manufacturing the same.

2. Discussion of the Related Art

Up until recent years, cathode ray tubes (CRTs) have been typically used to form display devices, such as televisions or monitors. However, cathode ray tubes are heavy, bulky and require high drive voltages. Nowadays, the use of flat panel displays is increasing because of their advantages of thin profile, light weight and low power consumption. Examples of flat panel displays include liquid crystal displays (LCDs), plasma display panels (PDPs), field emission displays (FEDs), and electroluminescence displays (ELDs) (which are also called electroluminescence devices).

FIG. 1 is a cross-sectional of a related art flat panel display. As shown in FIG. 1, the related art flat panel display 50 includes: first and second substrates 20 and 30 facing each other with a predetermined distance therebetween; first and second arrays 21 and 31 formed on facing surfaces of the first and second substrates 20 and 30, respectively; and a space 25 defined between the first and second substrates 20 and 30. In regard to the above described related art configuration of FIG. 1, the configuration of the arrays 21 and 31 is variable based on characteristics and/or type of the flat panel display. For example, the two arrays may be formed respectively on the substrates or may be formed together on just one of the substrates. Hereinafter, applications of the various flat panel displays as mentioned above will be briefly explained.

Plasma display panels are designed to display an image on a screen based on the principle that when ultraviolet light, emitted by gas filled between the upper and lower substrates, strikes phosphor, a specific visible light is generated corresponding to the type of phosphor. Thus, the phosphor acts to emit light using the ultraviolet light generated during the electric discharge through the gas. The flat panel displays of a plasma display panel are configured such that two glass substrates, each having electrodes, are attached with a predetermined gap therebetween having a plurality of small partitions, and the gap within in each of the partitions is filled with discharge gas, such as Ne or Xe, at a pressure of several hundreds of torr prior to the flat panel display panel being completely sealed.

An electroluminescence display includes: an upper substrate having no array; and a lower substrate having a thin film transistor array, and phosphor adapted to emit light in accordance with operation of the thin film transistor array. The electroluminescence devices are display devices based on the phenomenon of electroluminescence (EL) in that phosphor generates light when an electric field beyond a predetermined level is applied to the phosphor. The electroluminescence devices may be classified into an inorganic electroluminescence device or an organic electroluminescence device (OELD), in accordance with the type of phosphor light source having the excitation of carries.

In particular, the organic electroluminescence device is being recognized as a natural color display device since phosphors in the organic electroluminescence device can display colors throughout the entire visible light range, including blue color. Also, the organic electroluminescence device has several advantages, such as high brightness and low drive voltage, a great contrast ratio by virtue of self-luminescence, ultra-thin displays, and a relatively low environmental contamination due to having a simplified fabrication process. Moreover, the organic electroluminescence device can easily display moving images due to its short response time of several microseconds, and does not have a limited viewing angle. The organic electroluminescence device is stable even at low temperatures, and a drive circuit for the organic electroluminescence device can be easily designed and manufactured because of low drive voltages of DC 5 V to 15 V used in the organic electroluminescence device. Although the organic electroluminescence device has a configuration similar to an inorganic electroluminescence device, the organic electroluminescence device is designed to emit light via recombination of electrons and holes, and therefore, the organic electroluminescence device may be called an organic light emitting diode (OLED). Hereinafter, the term "organic electroluminescence device" will be used.

FIG. 2 is an exploded perspective view of a related art liquid crystal display. As shown in FIG. 2, the related art liquid crystal display includes first and second substrates 1 and 2 affixed to each other with a predetermined gap therebetween, and a layer 3 of liquid crystal molecules formed between the first and second substrates 1 and 2 via injection of the liquid crystal molecules. More specifically, the first substrate 1 has a plurality of gate lines 4 that are arranged in a first direction and a plurality of data lines 5 are arranged perpendicular to the gate lines 4 that define a plurality of pixel regions P. Each of the pixel regions P are provided with a pixel electrode 6. Further, each of the pixel regions P also includes a plurality of thin film transistors T adjacent to where the gate lines 4 and data lines 5 intersect, thereby serving to apply data signals of the data lines 5 to the respective pixel electrodes 6 in response to signals applied to the gate lines 4.

The second substrate 2 includes a black matrix layer 7 for shielding light except in the pixel regions P. Red, green, and blue color filter layers 8 are provided in the pixel regions P to render red, green, and blue colors, respectively. A common electrode 9 is provided on each of the color filter layers 8 to create an image together with the pixel electrodes 6.

In the case of the liquid crystal display having the above described configuration, the liquid crystal molecules of the layer 3 between the first and second substrates 1 and 2 are aligned under the influence of an electric field created between the pixel electrodes 6 and the common electrode 9. Thus, the quantity of light passing through the layer 3 of liquid crystal molecules is regulated based on the degree of alignment of the liquid crystal molecules 3 for the creation of an image. Heretofore, a variety of related art flat panel displays have been described, but these flat panel displays as stated above have the following problems.

All related art flat panel displays employ a pair of first and second substrates facing each other with a predetermined distance therebetween, and the first and second substrates are made of glass. However, these glass substrates, which are about half of the material costs for the flat panel displays, are expensive, resulting in an increase in the overall manufacturing costs of the flat panel displays. Further, the greater the size of the flat panel displays, the greater the cost due to the use of larger glass substrates. Accordingly, it is necessary to develop a material as substitute for one or both of the glass substrates, or other technologies for reducing the manufacturing costs of glass substrates.

SUMMARY OF THE INVENTION

Accordingly, the present invention is directed to a flat panel display and a method for manufacturing the same that substantially obviate one or more problems due to limitations and disadvantages of the related art.

An object of the present invention is to provide a flat panel display in which upper one of two substrates facing each other is a substitute for glass substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flat panel display includes a substrate, an array on the substrate, and a glass film formed by depositing glass powder over the substrate, including the array, melting the deposited glass powder over the array and hardening the deposited glass powder over the array.

In another aspect of the present invention, a flat panel display includes a substrate, an array on the substrate, and a glass film formed by coating glass paste over the substrate including the array, and melting the coated glass paste over the array and hardening the coated glass powder over the array the coated glass paste.

In another aspect, a flat panel display includes a glass substrate, a plurality of gate lines formed on the glass substrate in a first direction and having a plurality of gate electrodes at a gate insulation film formed over the glass substrate, including the gate lines, a semiconductor layer formed on the gate insulation film at positions corresponding to the gate electrodes therebelow, a plurality of data lines formed perpendicular to the first direction of the gate lines to define pixel regions, and having a plurality of source electrodes at predetermined positions thereof, a plurality of drain electrodes spaced apart from the respective source electrodes by a predetermined distance, an interlayer insulation film over the gate insulation film, including the data lines, a plurality of anodes connected to the drain electrodes through contact holes perforated through the interlayer insulation film, a plurality of partitions formed on the interlayer insulation film at regions except for the pixel regions, a plurality of organic matter layers filled between the partitions and adapted to emit light, a cathode formed over the glass substrate, including the partitions and the organic matter layers, a protective film formed on the cathode, and a glass film formed by depositing glass powder on the protective film, and melting the deposited glass powder and hardening the deposited glass powder.

In another aspect of the present invention, there is provided a method for manufacturing a flat panel display includes preparing a substrate, forming an array on the substrate, depositing glass powder over the substrate including the array, and melting the glass powder by heating the substrate, and hardening the molten glass powder at room temperature, to form a glass film made of the glass powder.

In another aspect of the present invention, there is provided a method for manufacturing a flat panel display includes forming a plurality of gate lines on a glass substrate in a direction, the gate lines having a plurality of gate electrodes forming a gate insulation film over the glass substrate including the gate lines, forming a semiconductor layer on the gate insulation film at positions corresponding to the gate electrodes therebelow, forming a plurality of data lines perpendicular to the gate lines to define pixel regions, and forming a plurality of source electrodes protruded from the data lines and a plurality of drain electrodes spaced apart from the source electrodes forming an interlayer insulation film on the gate insulation film, including the data lines, forming contact holes by selectively removing the gate insulation film, to expose portions of the drain electrodes, filling up the contact holes and forming a plurality of anodes on the pixel regions, forming a plurality of partitions on the interlayer insulation film at regions except for the pixel regions, forming a plurality of organic matter layers between the partitions to emit light, forming a cathode over the glass substrate, including the partitions and the organic matter layers, forming a protective film on the cathode, depositing glass powder on the protective film, and sintering the glass powder to form a glass film.

In yet another aspect of the present invention, a flat panel display includes a glass substrate having a first upper surface and a first lower surface, an operational flat panel array on the glass substrate, and a glass film formed over the operational flat panel array having a second upper surface and a second lower surface conforming to a shape of the operational flat panel array.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A flat panel display, which will be explained hereinafter, includes a glass film substitute for the upper one of two glass substrates that face each other in a flat panel device, the glass film being made from glass powder. More specifically, in the manufacture of the flat panel display, after a single glass substrate, that is, a lower glass substrate, is prepared and an array is formed on the lower glass substrate, the glass powder is provided on the array to form a flat glass film. In the following description, an organic electroluminescence device will be explained as one example of the flat panel display having a substitute glass substrate of a glass film made from glass powder. However, embodiments of the present invention include other types of flat panel displays. The flat panel display and a method for manufacturing the same in accordance with an embodiment of the present invention will be explained in detail with reference to FIG. 3.

Figure 1:
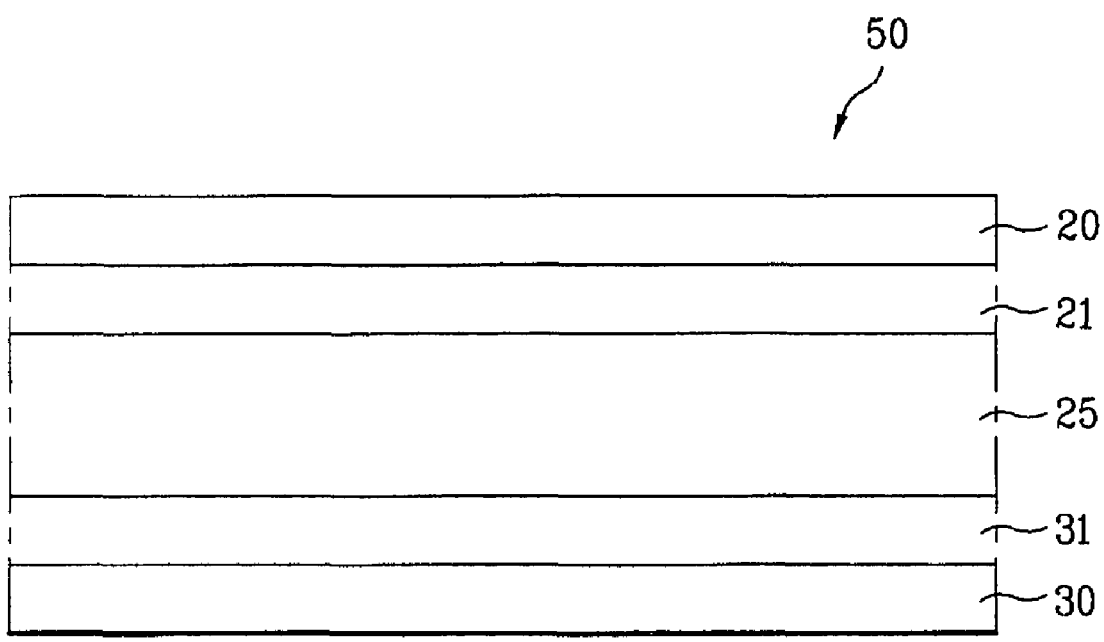
FIG. 1 is a cross-sectional view of the related art flat panel display.
Figure 2:
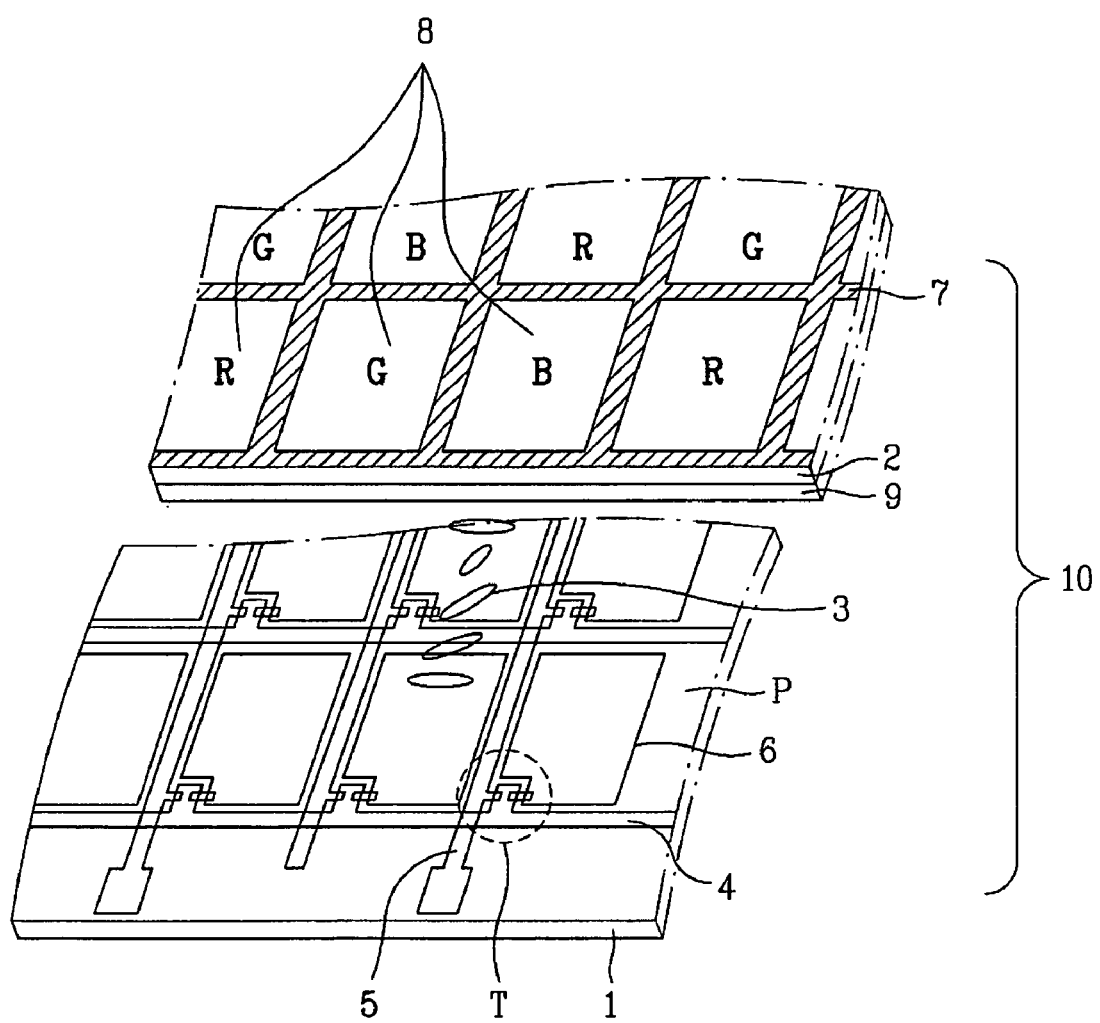
FIG. 2 is an exploded perspective view of the related art liquid crystal display.
Figure 3:
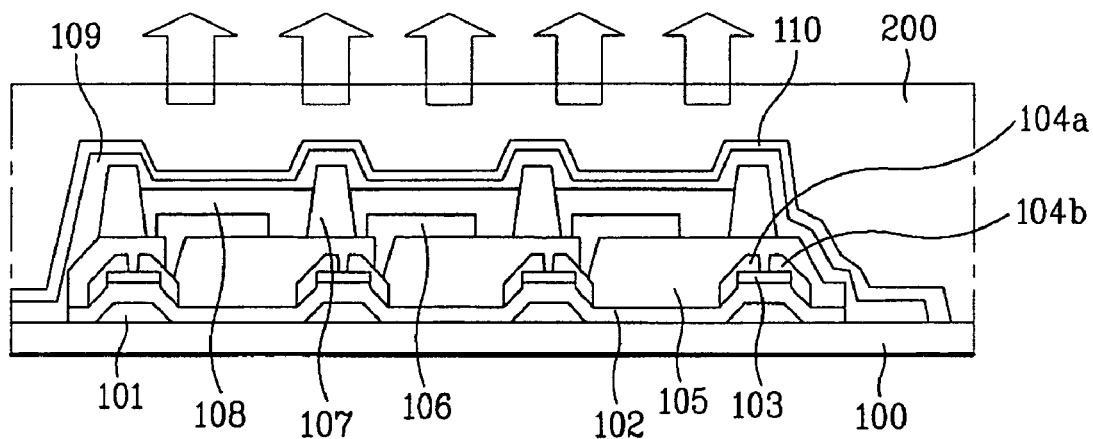
FIG. 3 is a cross-sectional view showing a flat panel display in accordance with an embodiment of the present invention.

FIG. 3 is a cross-sectional view of a flat panel display according to an embodiment of the present invention. As shown in FIG. 3, the flat panel display of an embodiment of the present invention includes: a glass substrate 100; an array formed on the glass substrate 100 (shown as reference numeral 150 of FIG. 4C); and a glass film 200 formed on the array via a deposition of glass powder and then firing the glass powder. More specifically, the array includes a plurality of gate lines (not shown) arranged on the glass substrate 100 in a first direction with a plurality of gate electrodes 101 protruded upward from predetermined positions thereof; a gate insulation film 102 formed over the gate line on the glass substrate 100; a semiconductor layer 103 formed on the gate insulation film 102 at positions corresponding to the gate electrodes 101 therebelow; a plurality of data lines (not shown) which are arranged perpendicular to the first direction of the gate lines and have a plurality of source electrodes 104a protruded upward from predetermined positions thereof; a plurality of drain electrodes 104b spaced apart from the source electrodes 104a by a predetermined distance, respectively; an interlayer insulation film 105 over the gate insulation film 102, including the data lines; a plurality of anodes connected to the drain electrodes 104b through contact holes of the interlayer insulation film 105; a plurality of partitions 107 formed on the interlayer insulation film 105 at positions where the anodes 106 are not formed; organic matter layers 108 filled between the partitions 107 and configured in groups of three different colors such that each group can emit light of red, green, and blue colors, respectively; a cathode 109 formed over the substrate 100 including the partitions 107 and the organic matter layers 108; and a protective film 110 formed on the cathode 109. The glass film 200, which serves as an upper substrate, is formed by printing the glass powder on the protective film 110.

The gate lines (which are not shown, but exist in the same layer as the gate electrodes 101) and the data lines (which are not shown, but exist in the same layer as the source and drain electrodes 104a and 104b) define pixel regions. The anodes 106 and the organic matter layers 108 are formed in pixel regions to correspond to each other. Thus, the anodes 106 cooperate with the cathode 109 to make the diodes function. Accordingly, the organic matter layers 108 are operated to emit an amount of light corresponding to the quantity of current flowing through the diodes.

The gate electrodes 101 protrude upward from the gate lines, the source and drain electrodes 104a and 104b protrude upward from the data lines, and the semiconductor layer 103 constitute thin film transistors in the vicinity of the regions where the gate lines and the data lines cross. In this case, both the source and drain electrodes 104a and 104b are formed on the semiconductor layer 103 to be symmetrically located at opposite sides of the semiconductor layer 103.

The glass film 200 is not a previously manufactured substrate, but is manufactured by uniformly depositing glass powder, in the form of particles, on the array, including the protective film, using dispensing equipment, melting the deposited glass powder by heating to create cohesion between the particles of the glass powder while in a molten state and then hardening the molten glass powder. The glass powder has the characteristic of being in a particle phase at room temperature, but the fine particles are melted and crosslinked with each other when a high temperature is applied to the fine particles so that the glass powder becomes molten. After the molten glass powder hardens and returns to room temperature or completes an aging process, the glass powder hardens into a glass film 200 having a flat upper surface parallel to the upper surface of the lower glass substrate 100 and a lower surface of the glass film 200 conforming to the shape of the array.

The glass powder can include ZnO, $SiO_2$ and BaO particles, and a binder for crosslinking of the particles. The size of the particles included in the glass powder is approximately 1 to 10 μm. In this case, the glass powder is fired at a temperature ranging from approximately 300 to 900 degrees Celsius for approximately 5 to 30 minutes. The above firing temperature is sufficiently low to prevent transformation of the glass substrate 100 or damage to the array formed on the glass substrate 100. The firing temperature of the glass powder may be approximately 300 to 500 degrees Celsius when considering strains on the glass substrate 100 caused by heat.

The thickness of the glass film 200, which is formed via the deposition and sintering of the glass powder, can be changed in accordance with the quantity of glass powder deposited. Accordingly, the glass film 200 may be formed to have various thicknesses as the glass film 200 conforms to the array. For example, the thickness of the glass film 200 can range from about 10 to 300 μm.

The flat panel display, for example, the organic electroluminescence device, is adapted to display an image at a surface of the second substrate 200 in accordance with a heat emission operation of the organic matter layers. Hereinafter, a method for manufacturing the flat panel display of the present invention will be explained with reference to the accompanying drawings.

Figure 4A:
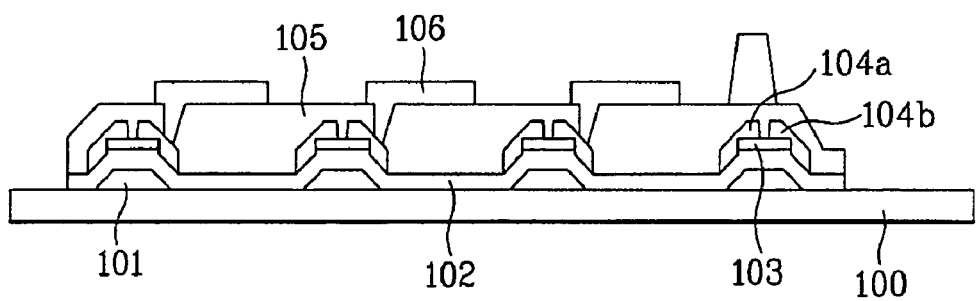
FIGS. 4A to 4D are cross-sectional views showing sequential processes of a method for manufacturing the flat panel display in accordance with an embodiment of the present invention.

FIGS. 4A to 4D are cross-sectional views showing sequential processes of the method for manufacturing the flat panel display in accordance with an embodiment of the present invention. Referring to FIG. 4A, first, after the glass substrate 100 is prepared and a metallic material is deposited on the glass substrate 100, the deposited metallic material is selectively removed such that the gate electrodes 101 protrude from predetermined positions of the respective pixel regions. Thereby, the plurality of gate lines (not shown) are formed in a first direction. Then, the gate insulation film 102 is formed over the glass substrate 100, including the gate electrodes 101 and the gate lines.

Subsequent to the gate line formation, the semiconductor layer 103 is formed on the gate electrodes 101 at predetermined positions. In this case, the semiconductor layer 103 may be a lamination of an amorphous silicon layer and a doped silicon layer (n+layer). Alternatively, the semiconductor layer 103 may be made of polycrystalline silicon.

After the semiconductor layer 103 is formed, a metallic material is deposited over the gate insulation film 102, including the semiconductor layer 103. The deposited metallic material is selectively removed to form the plurality of data lines (not shown) perpendicular to the first direction of the gate lines. Source electrodes 104a protrude from the data lines at predetermined positions of the pixel regions adjacent to where the gate lines and the data lines cross. After forming the source electrodes 104a, the drain electrodes 104b are formed to be spaced apart from the respective source electrodes 104a by a predetermined distance.

Next, the interlayer insulation film 105 is formed on the glass substrate 100, including the source and drain electrodes 104a and 104b. The interlayer insulation layer 105 is then selectively etched to form contact holes. The contact holes serve to expose a top portion of the drain electrode 104b.

The contact holes are filled up with a transparent electrode, such as indium tin oxide (ITO), indium zinc oxide (IZO), or indium tin-zinc oxide (ITZ), that is deposited over the interlayer insulation film 105. The transparent electrode then is selectively removed to form the plurality of anodes 106 that are electrically connected to the drain electrodes 104b.

Figure 4B:
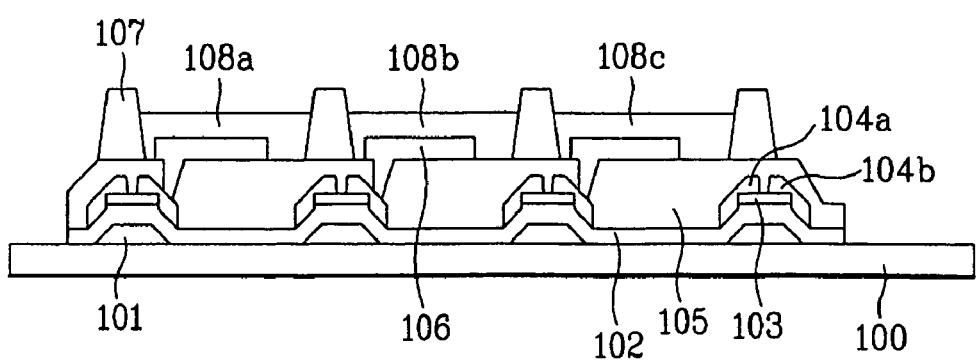

Referring to FIG. 4B, the partitions 107 are formed on the interlayer insulation film 105 at positions corresponding to the gate electrodes 101 therebelow. In this case, the partitions 107 are defined with an inorganic film material obtained by depositing the inorganic material, such as $SiN_x$ or $SiO_2$, over the interlayer insulation film 105, and selectively removing the deposited inorganic material at portions corresponding to the pixel regions. The height of the partitions 107 can be more than approximately 5000 μm.

Subsequently, organic matters, which can emit light of red, green, and blue colors, respectively, are filled between the partitions 107 to form red, green and blue organic matter layers 108a, 108b, and 108c. The formation of the organic matter layers 108a, 108b, and 108c is performed via a printing or coating process. The height of the organic matter layers 108a, 108b, and 108c is less than approximately 2000 μm, to have a height difference with the partitions 107. The height difference is for the sake of preventing the organic matter from overflowing the partitions 107.

Figure 4C:
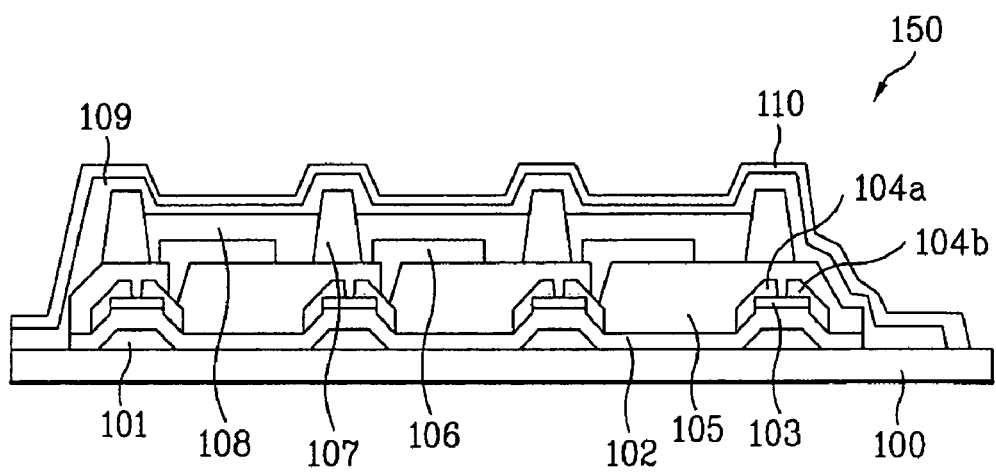
Figure 4D:
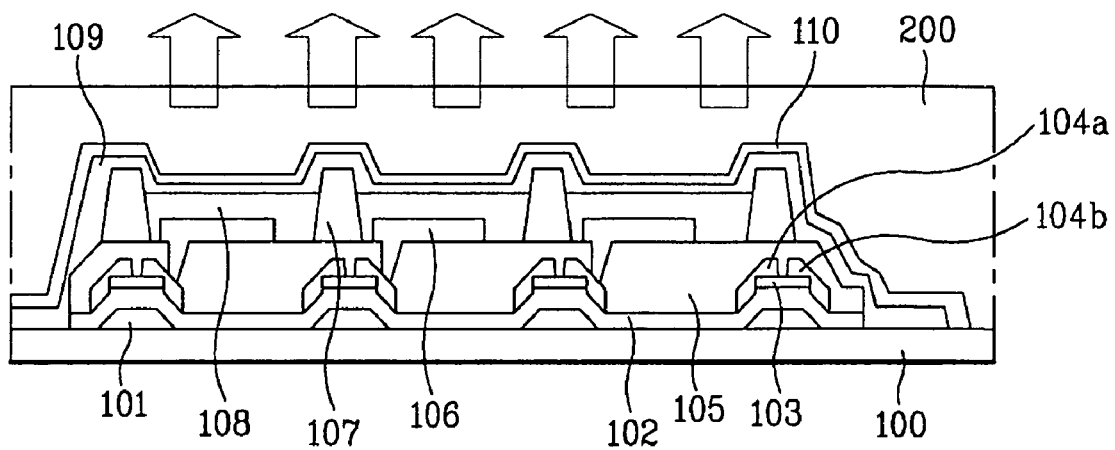

As shown in FIG. 4C, the cathode 109 is formed over a surface of the glass substrate 100, including the partitions 107 and the organic matter layers 108a, 108b, and 108c. Then, the protective film 110 is formed over the cathode 109. Subsequently, glass powder is spread on the protective film 110, and then, is fired, to form the glass film 200.

Figure 5:
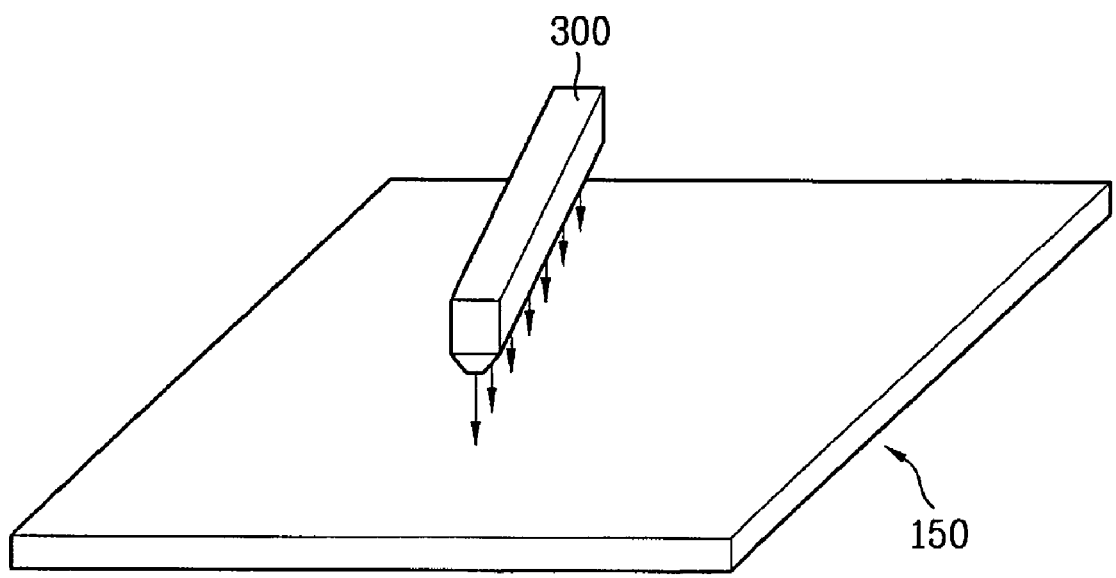
FIG. 5 is a perspective view showing a method for depositing glass powder of the flat panel display in accordance with an embodiment of the present invention.

FIG. 5 is a perspective view showing a deposition process for the glass powder of the flat panel display in accordance with an embodiment of the present invention. As shown in FIG. 5, the completed lower array substrate 150 is located on a stage (not shown) and a printing process for depositing the glass powder is performed by either moving the dispenser 300 or the stage. The deposition thickness of the glass powder is determined such that the glass film, obtained by firing the particles of the glass powder, has a thickness ranging from 10 μm to a value equal to the thickness of the glass substrate 100. The size of particles is regulated to be within a range from about 1 to 10 μm. As stated above, the particles are a mixture of ZnO, $SiO_2$, BaO particles and a binder. Due to the spaces between the particles of the glass powder immediately after deposition, the glass powder is initially deposited to have a thickness slightly thicker than a desired thickness of the glass film.

Generally, a flat panel display includes upper and lower substrates facing each other, and an array formed between the upper and lower substrates. In the related art, previously manufactured glass substrates are used as the upper and lower substrates. In the method for manufacturing the flat panel display according to embodiments of the present invention, however, the lower substrate is formed of the glass substrate on which the array is formed, and the upper substrate is substituted by the glass film obtained via a deposition process using a dispenser or coating process. Accordingly, the number of previously manufactured glass substrates, which are a major portion of manufacturing costs, is reduced. Further, it will be understood that the method for manufacturing the flat panel display according to embodiments of the present invention may have the same effects as the above description even when the glass film is formed on the lower array substrate by coating a glass paste in a sol state, instead of using the glass powder.

Although the above description exemplifies the organic electroluminescence device among a variety of flat panel displays, it will be appreciated that the glass powder or glass paste may be used to substitute for one of two facing substrates of other types of flat panel displays. The method for manufacturing a flat panel display includes the steps of: preparing a single substrate and forming an array on the substrate; depositing or coating glass powder or glass paste on the substrate having an array; melting the glass powder or glass paste under predetermined conditions to achieve crosslinking of particles of the glass powder or glass paste; and completing a glass film on the array. Thus, with the flat panel display manufacturing method of the present invention, the upper glass film can be directly formed on the lower substrate including the array via the deposition or coating process of the glass powder or glass paste, without requiring a separate encapsulation process that has been typically performed to attach an upper substrate to a lower substrate. Eliminating the conventional encapsulation process has the effect of simplifying the overall manufacturing process of the flat panel display. According to embodiments of the present invention, one of two substrates, which occupy a half of the overall manufacturing costs of the flat panel display, can be substituted by a glass film that is formed of glass powder or glass paste, and therefore, this results in an efficient reduction in economical burden in the manufacture of the flat panel display, more particularly, in relation with a large flat panel display.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a flat panel display comprising:
    preparing a lower glass substrate;
    forming an array having metal lines crossing each other on the lower glass substrate;
    depositing glass powder over the lower glass substrate including the array; and
    melting the glass powder by heating the lower glass substrate, and hardening the molten glass powder at room temperature, to form a glass film made of the glass powder,
    wherein the glass film is used as an upper glass substrate and
    wherein the glass powder consists of ZnO, $SiO_2$, and BaO particles, and a binder and wherein the particles have a size ranging from 1 μm to 10 μm.

2. The method as set forth in claim 1, wherein the deposition of the glass powder is performed by use of a dispenser.

3. The method as set forth in claim 1, wherein the lower glass substrate is heated to a temperature ranging from about 300 to 500 degrees Celsius for about 5 to 30 minutes.

4. A method for manufacturing a flat panel display, comprising:
    forming a plurality of gate lines on a lower glass substrate in a direction, the gate lines having a plurality of gate electrodes;
    forming a gate insulation film over the lower glass substrate including the gate lines;

forming a semiconductor layer on the gate insulation film at positions corresponding to the gate electrodes therebelow;

forming a plurality of data lines perpendicular to the gate lines to define pixel regions, and forming a plurality of source electrodes protruded from the data lines and a plurality of drain electrodes spaced apart from the source electrodes;

forming an interlayer insulation film on the gate insulation film, including the data lines;

forming contact holes by selectively removing the gate insulation film, to expose portions of the drain electrodes;

filling up the contact holes and forming a plurality of anodes on the pixel regions;

forming a plurality of partitions on the interlayer insulation film at regions except for the pixel regions;

forming a plurality of organic matter layers between the partitions to emit light;

forming a cathode over the lower glass substrate, including the partitions and the organic matter layers;

forming a protective film on the cathode;

depositing glass powder over the protective film, entirely; and sintering the glass powder to form a glass film, wherein the glass film is used as an upper glass substrate and wherein the glass powder consists of ZnO, $SiO_2$, and BaO particles, and a binder and wherein the particles have a size ranging from 1 μm to 10 μm.

5. The method as set forth in claim 4, wherein the deposition of the glass powder is performed by a dispenser.

6. The method as set forth in claim 4, wherein the sintering of the glass powder is performed by heating the lower glass substrate at a temperature ranging from about 300 to 500 degrees Celsius for about 5 to 30 minutes to melt the glass powder, and hardening the molten glass powder.

* * * * *